United States Patent
Jacob et al.

(10) Patent No.: US 10,381,406 B1
(45) Date of Patent: *Aug. 13, 2019

(54) INTEGRATED CIRCUITS INCLUDING MAGNETIC RANDOM ACCESS MEMORY STRUCTURES HAVING REDUCED SWITCHING ENERGY BARRIERS FOR DUAL BIT OPERATION AND METHODS FOR FABRICATING THE SAME

(71) Applicant: GLOBALFOUNDRIES, Inc., Grand Cayman (KY)

(72) Inventors: Ajey Poovannummoottil Jacob, Malta, NY (US); Jaiswal Akhilesh, Malta, NY (US)

(73) Assignee: Globalfoundries, Inc., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 15/898,555

(22) Filed: Feb. 17, 2018

(51) Int. Cl.
| | |
|---|---|
| G11C 11/16 | (2006.01) |
| H01L 27/22 | (2006.01) |
| H01L 43/04 | (2006.01) |
| H01L 43/14 | (2006.01) |
| H01L 43/06 | (2006.01) |

(Continued)

(52) U.S. Cl.
CPC .......... *H01L 27/228* (2013.01); *G11C 11/161* (2013.01); *G11C 11/1673* (2013.01); *G11C 11/18* (2013.01); *H01L 43/04* (2013.01); *H01L 43/065* (2013.01); *H01L 43/14* (2013.01); G11C 11/1675 (2013.01); H01L 43/10 (2013.01)

(58) Field of Classification Search
None
See application file for complete search history.

(56) References Cited

U.S. PATENT DOCUMENTS

| | | | |
|---|---|---|---|
| 6,639,830 B1 * | 10/2003 | Heide | ............ G11C 11/005 365/158 |
| 9,230,626 B2 | 1/2016 | Buhrman et al. | |
| 9,373,383 B2 | 6/2016 | DeBrosse | |

(Continued)

OTHER PUBLICATIONS

Kim et al., "DSTT-MRAM: Differential Spin Hall MRAM for On-chip Memories", School of Electrical and Computer Engineering, Purdue University, 11 pages.

(Continued)

*Primary Examiner* — Douglas King
(74) *Attorney, Agent, or Firm* — Lorenz & Kopf, LLP

(57) ABSTRACT

Integrated circuits and methods for fabricating integrated circuits are provided herein. The integrated circuit includes a plurality of MRAM structures. The integrated circuit further includes a first lower MTJ stack with the first lower MTJ stack including a first lower free layer. The integrated circuit further includes a spin orbit torque coupling layer overlying the first lower MTJ stack. The integrated circuit further includes a first upper MTJ stack overlying the spin orbit torque coupling layer and the first lower MTJ stack with the first upper MTJ stack including a first upper free layer. The switching energy barrier for each of the first lower free layer and the first upper free layer is reduced in the presence of an electrical voltage passing through each of the MTJ stacks. The first lower free layer and said first upper free layer are configured to have magnetizations independent of each other.

6 Claims, 11 Drawing Sheets

(51) Int. Cl.
*G11C 11/18* (2006.01)
*H01L 43/10* (2006.01)

(56) References Cited

U.S. PATENT DOCUMENTS

| | | | |
|---|---|---|---|
| 9,858,575 B2 | 1/2018 | Meredith et al. | |
| 9,858,975 B1* | 1/2018 | Hatcher | G11C 11/1655 |
| 2005/0189574 A1* | 9/2005 | Nguyen | B82Y 25/00 |
| | | | 257/295 |
| 2011/0014500 A1* | 1/2011 | Horng | C23C 14/3414 |
| | | | 428/846.3 |
| 2012/0243297 A1* | 9/2012 | Katayama | G11C 11/1659 |
| | | | 365/148 |
| 2012/0257445 A1* | 10/2012 | Lee | G11C 5/063 |
| | | | 365/158 |
| 2014/0124882 A1 | 5/2014 | Khalili Amiri et al. | |
| 2014/0264513 A1 | 9/2014 | De Brosse et al. | |
| 2015/0213869 A1* | 7/2015 | Wu | G11C 11/1693 |
| | | | 365/154 |
| 2016/0329087 A1* | 11/2016 | Guo | G11C 11/16 |

OTHER PUBLICATIONS

Yoda et al., "Voltage Control Spintronics Memory (VoCSM) Having Potentials of Ultra-Low Energy-Consumption and High-Density", 2016, pp. 679-682, IEEE, IEDM, 16.
U.S. Appl. No. 15/898,562, Official Action dated Nov. 1, 2018, 13 pages.

\* cited by examiner

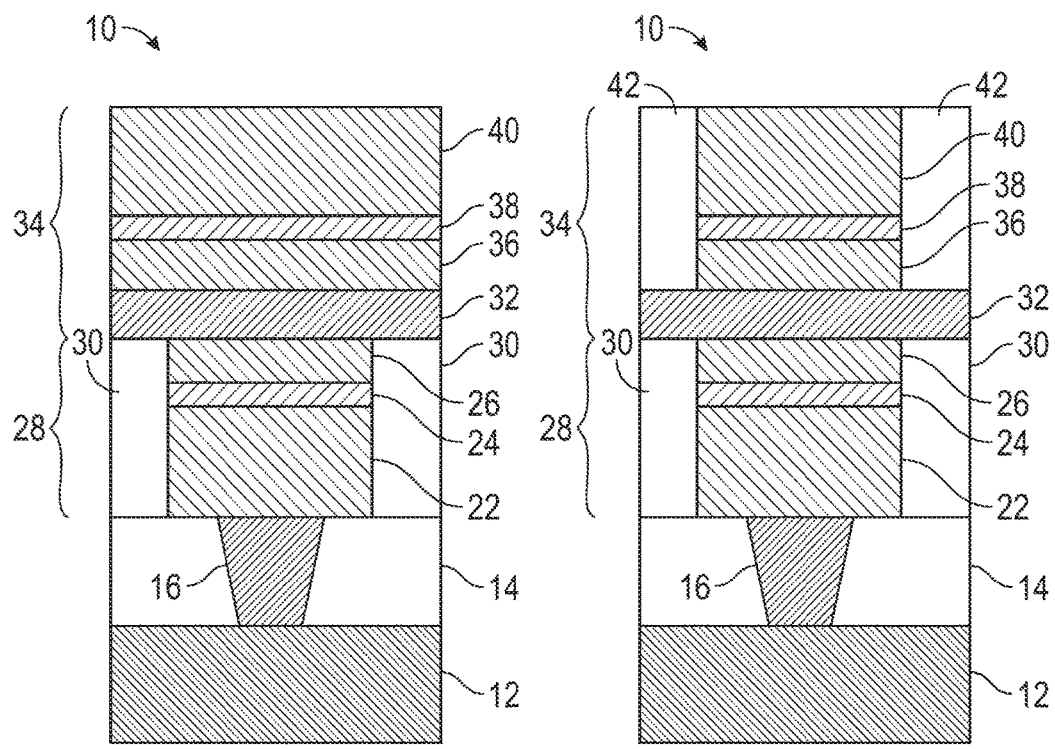

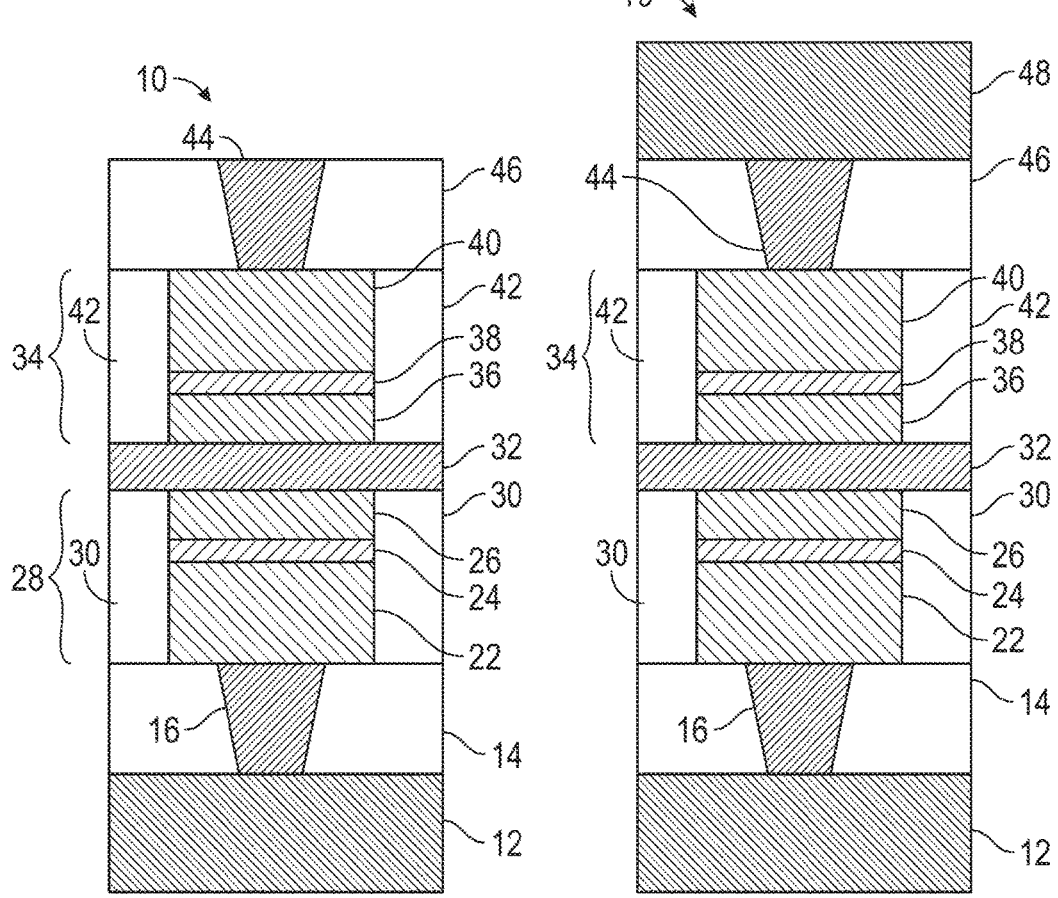

INTEGRATED CIRCUITS INCLUDING MAGNETIC RANDOM ACCESS MEMORY STRUCTURES HAVING REDUCED SWITCHING ENERGY BARRIERS FOR DUAL BIT OPERATION AND METHODS FOR FABRICATING THE SAME

TECHNICAL FIELD

The technical field generally relates to integrated circuits, and more particularly relates to integrated circuits with magnetic random access memory (MRAM) structures.

BACKGROUND

Magnetic random access memory (MRAM) is a non-volatile computer memory technology based on magnetoresistance. MRAM differs from volatile random access memory (RAM) in several respects. Because MRAM is non-volatile, MRAM can maintain memory content when the memory device is not powered. Though non-volatile RAM is typically slower than volatile RAM, MRAM has read and write response times that are comparable to that of volatile RAM. Unlike typical RAM technologies that store data as electric charge, MRAM data is stored by magnetoresistive elements. Generally, the magnetoresistive elements are made from two magnetic layers, each of which holds a magnetization. The two magnetic layers are separated from one another by an insulating barrier layer, or a conductive non-magnetic layer such as Cu. When two magnetic layers are separated by a non-magnetic layer that is an insulator, the resulting magnetoresistive devices is referred to as a "magnetic tunnel junction" ("MTJ"). The magnetization of one of the magnetic layers (e.g., the "pinned layer" or "fixed layer") is fixed in its magnetic orientation, and switching energy barrier for switching the magnetization of the other layer (e.g., the "free layer") can be reduced by applying a voltage across the free layer such that interface anisotropy can be modulated in response to the voltage through voltage controlled magnetic anisotropy (VCMA) phenomenon.

In an attempt to find alternate and more energy-efficient switching mechanism for MTJs, spin orbit torque (SOT) phenomenon is considered as a promising way to achieve highly energy-efficient and faster switching of MTJs. SOT switching involves passing a current through a material exhibiting high spin-orbit-coupling (for example, heavy metals like Pt, Ta etc.). Due to the spin-orbit-coupling, the electrical current passing through the heavy metals splits into two spin polarized currents called the up-spin current and the down-spin current. An MTJ formed on top of the heavy metal experiences current induced torque due to such spin polarized currents, which can switch the state of the MTJ. The energy efficiency of the SOT mechanism results from the fact that the SOT mechanism exhibits high spin polarizing efficiency. Thus, the VCMA effect can be used to switch the magnetic orientation of the free layer either independently or in conjunction to a spin polarized current. Thus, the VCMA effect along with the spin-polarized current (SOT) effect can cause the magnetic orientations of the two magnetic layers to be either parallel, giving a lower electrical resistance across the layers (logic 0), or antiparallel, giving a higher electrical resistance across the layers (logic 1).

However, such SOT MRAM devices are three- or four-terminal structures as opposed to the two-terminal conventional MRAM device. The three or four terminal device structure necessitates use of multiple transistor switches for proper isolation of each bit-cell thereby leading to high area overhead and hence low memory density. Consequently, this also increases the overall energy consumption and also the cost of manufacturing as fewer cells can be patterned on a single silicon wafer.

Accordingly, it would be desirable to provide integrated circuits and methods for fabricating integrated circuits with MRAM structures that exhibit low switching energy by combination of the SOT and the VCMA phenomena while reducing the number of transistors required per bit-cell resulting in high memory density along with energy efficient switching. Furthermore, other desirable features and characteristics of the present disclosure will become apparent from the subsequent detailed description and the appended claims, taken in conjunction with the accompanying drawings and the foregoing technical field and background.

BRIEF SUMMARY

An integrated circuit is provided herein. In an embodiment, the integrated circuit includes a plurality of magnetic random access memory (MRAM) structures and a semiconductor substrate. The integrated circuit further includes a first lower magnetic tunnel junction stack (MTJ stack) overlying the semiconductor substrate with the first lower MTJ stack including a first lower free layer. The integrated circuit further includes a spin orbit torque coupling layer overlying the first lower MTJ stack. The integrated circuit further includes a first upper MTJ stack overlying the spin orbit torque coupling layer and the first lower MTJ stack with the first upper MTJ stack including a first upper free layer. Each of the first lower free layer and the first upper free layer has a switching energy barrier for switching between a parallel magnetization and an antiparallel magnetization. The switching energy barrier for each of the first lower free layer and the first upper free layer is reduced in the presence of an electrical voltage across each of the MTJ stacks. The first lower free layer and said first upper free layer are configured to have complement magnetizations.

In another embodiment, a method for fabricating an integrated circuit including a plurality of magnetic random access memory (MRAM) structures is provided herein. The method includes forming a first lower magnetic tunnel junction stack (MTJ stack) overlying a semiconductor substrate with the first lower MTJ stack comprising a first lower free layer. The method further includes forming a spin orbit torque coupling layer overlying the first lower MTJ stack. The method further includes a first upper MTJ stack overlying the spin orbit torque coupling layer and the first lower MTJ stack. The method further includes a second upper MTJ stack overlying the spin orbit torque coupling layer and the second lower MTJ stack with the first upper MTJ stack comprising a first upper free layer. Each of the first lower free layer and the first upper free layer has a switching energy barrier for switching between a parallel magnetization and an antiparallel magnetization. The switching energy barrier for each of the first lower free layer and the first upper free layer is reduced in the presence of an electrical voltage across each of the MTJ stacks. The first lower free layer and said first upper free layer are configured to have magnetizations independent of each other.

BRIEF DESCRIPTION OF THE DRAWINGS

The present disclosure will hereinafter be described in conjunction with the following drawing Figures, wherein like numerals denote like elements, and wherein:

FIGS. 1A, 1B, 1C, 1D, 1E, 1F, 1G, 1H, 1I, 1J, 2A, 2B, 3, 4, 5, 6, 7, and 8 are partial cross section views illustrating integrated circuits with MRAM structures and methods for fabricating integrated circuits with MRAM structures in accordance with exemplary embodiments of the present disclosure.

DETAILED DESCRIPTION

Figure 1A:
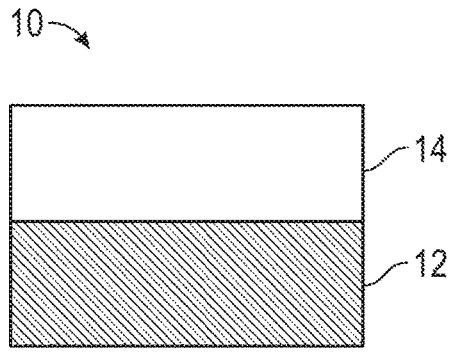

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Embodiments of the present disclosure are generally directed to integrated circuits with magnetic random access memory structures and methods for fabricating integrated circuits with magnetic random access memory structures. For the sake of brevity, conventional techniques related to conventional device fabrication may not be described in detail herein. Moreover, the various tasks and processes described herein may be incorporated into a more comprehensive procedure or process having additional functionality not described in detail herein. In particular, various techniques in semiconductor fabrication processes are well-known and so, in the interest of brevity, many conventional techniques will only be mentioned briefly herein or will be omitted entirely without providing the well-known process details. Further, it is noted that integrated circuits include a varying number of components and that single components shown in the illustrations may be representative of multiple components. In particular, various steps in the manufacture of semiconductor-based memory structures are well-known and so, in the interest of brevity, many conventional steps will only be mentioned briefly herein or will be omitted entirely without providing the well-known process details.

The drawings are semi-diagrammatic and not to scale and, particularly, some of the dimensions are for the clarity of presentation and are shown exaggerated in the drawings. Similarly, although the views in the drawings for ease of description generally show similar orientations, this depiction in the drawings is arbitrary. Generally, the integrated circuit can be operated in any orientation. As used herein, it will be understood that when a first element or layer is referred to as being "over," "overlying," "under," or "underlying" a second element or layer, the first element or layer may be directly on the second element or layer, or intervening elements or layers may be present where a straight line can be drawn through and between features in overlying relationship. When a first element or layer is referred to as being "on" a second element or layer, the first element or layer is directly on and in contact with the second element or layer. Further, spatially relative terms, such as "upper," "over," "lower," "under," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "under" other elements or features would then be oriented "above" the other elements or features. Thus, the exemplary term "under" can encompass either an orientation of above or below. The device may be otherwise oriented (rotated 90 degrees or at other orientations) and the spatially relative descriptors used herein may likewise be interpreted accordingly.

As used herein, the term "substantially" refers to the complete, or nearly complete, extent or degree of an action, characteristic, property, state, structure, item, or result. As an arbitrary example, an object that is "substantially" enclosed would mean that the object is either completely enclosed or nearly completely enclosed so as to have the same overall result as if the object were completely enclosed.

FIGS. 1A-1J illustrate, in cross section, integrated circuits 10 including a plurality of MRAM structures and methods for fabricating integrated circuits 10 including a plurality of MRAM structures in accordance with exemplary embodiments of the present disclosure. It is to be appreciated that any description of elements herein being stated as singular, as they relate to the MRAM structures, may also be contemplated as plural, and vise-versa. With attention to FIG. 1A, the cross-sectional view illustrates a bottom electrode layer 12 overlying a semiconductor substrate (not shown). Though not illustrated for simplicity in the Figures, the bottom electrode layer 12 may be formed overlying an active region of the semiconductor substrate forming part of the integrated circuit 10 and including various microelectronic elements (not shown).

In embodiments, the bottom electrode layer 12 is formed of a conductive metal material such as of copper, doped copper alloy (Cu Mx), or a combination thereof. A bottom dielectric layer 14 may be formed overlying the bottom electrode layer 12. In embodiments, the bottom dielectric layer 14 is formed of one or more low-k dielectric materials, such as silicon oxide (SiO), silicon dioxide ($SiO_2$), a porous oxide/porous doped oxide, un-doped silicate glass (USG), silicon nitride, silicon oxynitride, or other commonly used materials. The dielectric constants (k value) of the low-k dielectric materials may be less than about 3.9, for example, less than about 2.8.

Figure 1B:
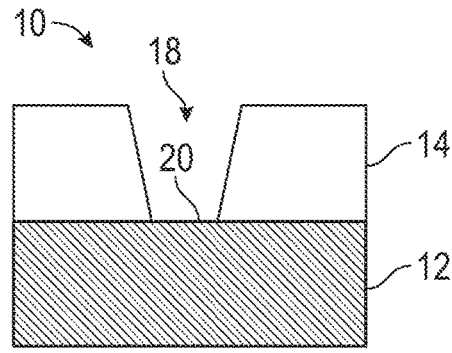
Figure 1C:
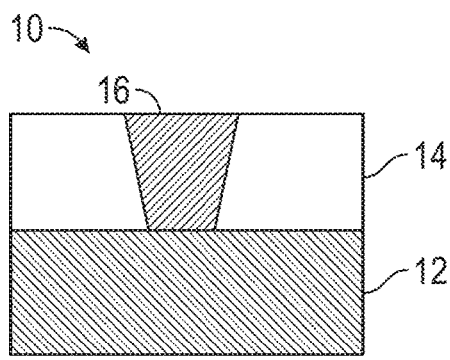

With attention to FIGS. 1B and 1C, a conductive via structure 16 may be disposed on the bottom electrode layer 12 and extending through the bottom dielectric layer 14. The conductive via structures 16 may be formed by etching a cavity 18 through the bottom dielectric layer 14 and expose a portion of an upper surface 20 of the bottom electrode layer 12 and filling the cavity 18 with a conductive material. In this regard, known photolithographic patterning and etching procedures are used to form the cavity 18 through the bottom dielectric layer 14. That is, a photoresist layer (not separately illustrated) may be deposited overlying the bottom dielectric layer 14 and then may be exposed to form an image pattern, followed by application of a developing solution to form pattern openings within the photoresist layer. With the photoresist layer thus patterned, the bottom dielectric layer 14 may be etched to form the cavity 18, which is then filled with the conductive material to form the conductive via structure 16. In embodiments, the conductive material may be a copper-containing material, an aluminum-containing material, tungsten-containing material, or combinations thereof. In certain embodiments, the conductive material is a copper-containing material. Chemical mechanical polishing may be used to remove excess conductive material, such that an upper surface of the conductive via structure 16 and an upper surface of the bottom dielectric layer 14 are substantially co-planar, as illustrated.

Figure 1D:
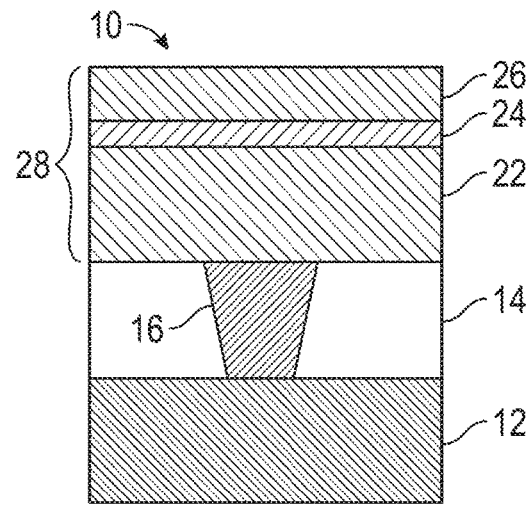

With reference now to FIG. 1D, in embodiments, a series of material layers 22, 24, and 26 of the MRAM structures are formed overlying one another. As illustrated, a fixed layer 22 is formed overlying the conductive via structure 16, a tunnel barrier layer 24 is formed overlying the fixed layer 22, and a free layer 26 is formed overlying the tunnel barrier layer 24. Layers 22, 24, and 26 form the basis of a lower magnetic tunnel junction stack (MTJ stack) 28 of each of the MRAM structures to be formed. The bottom electrode layer 12 is electrically connected to the fixed layer 22 of the lower MTJ stack 28 of the corresponding MRAM structure to be formed by the conductive via structure 16. The thicknesses of each such layer 22, 24, and 26 will depend on the overall dimensions of the corresponding MRAM structure to be formed, as well as the operational parameters of the corresponding MRAM structure to be formed, as is known in the art. The processes used for forming such layers are conventional with respect to the particular material selected.

In one embodiment, the fixed layer 22 includes, and/or is formed from, an anti-ferromagnetic material. For example, the fixed layer 22 may include a metal alloy such as platinum manganese (PtMn), iridium manganese (IrMn), nickel manganese (NiMn), or iron manganese (FeMn), or combinations thereof. It will be appreciated that the fixed layer 22 could include multiple layers such as a synthetic anti-ferromagnetic (SAF) layer to ensure that the fixed layer 22 magnetism is fixed. Other fine-tuning layer(s) to improve coupling could also be added, in an embodiment. The tunnel barrier layer 24 includes, and/or is formed from, an insulating tunnel barrier material, such as magnesium oxide, amorphous aluminum oxide, or silicon dioxide, or combinations thereof. In certain embodiments, the tunnel barrier layer 24 includes magnesium oxide. In certain embodiments, the tunnel barrier layer 24 has a first surface (not shown) adjacent the free layer 26 and a second surface (not shown) adjacent the fixed layer 22 with the first surface and the second surface defining a tunnel barrier layer thickness (not shown) therebetween in an amount of at least about 1 nanometer (nm), alternatively at least about 1.2 nm, or alternatively at least about 1.4 nm. The free layer 26 includes, and/or is formed from, a ferromagnetic material. For example, the free layer 26 may include a metal alloy such as cobalt iron boron (CoFeB). In certain embodiments, the free layer 26 has a first surface (not shown) adjacent opposite the fixed layer 22 and a second surface (not shown) adjacent the tunnel barrier layer 24 with the first surface and the second surface defining a free layer thickness (not shown) therebetween in an amount of no greater than about 1.4 nm, alternatively no greater than about 1.2 nm, or alternatively no greater than about 0.9 nm.

Figure 1E:
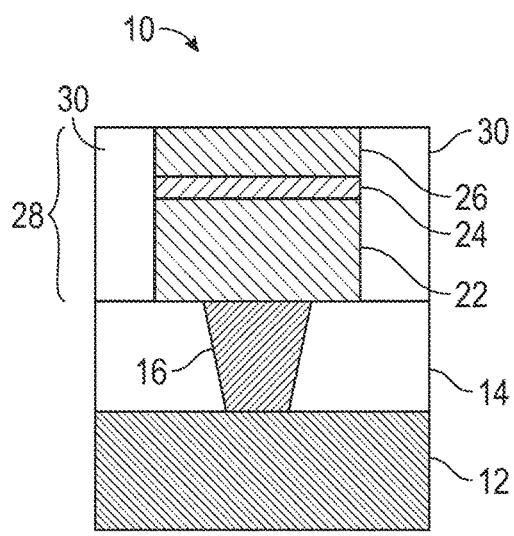

With reference now to FIG. 1E, in embodiments, a portion of the fixed layer 22, a portion of the tunnel barrier layer 24, and a portion of the free layer 26 is removed, as illustrated. The removal of the portions of layers 22, 24, and 26 may be accomplished using any conventional patterning and etching process. For example, a photoresist layer (not separately illustrated) is deposited over the free layer 26 and then is exposed to an image pattern and treated with a developing solution to form a pattern opening within the photoresist layer. With the photoresist layer thus patterned, the layers 22, 24, and 26 are etched away in lateral areas of the layers 22, 24, and 26 remaining in a central area. The fixed layer 22, the tunnel barrier layer 24, and the free layer 26 each have a width in a width direction (the term "width direction" is used herein with respect to a direction that is substantially parallel to an upper surface of the semiconductor substrate of the integrated circuit 10 as shown in FIGS. 1A-1J) that is substantially the same with respect to each such layer 22, 24, and 26. That is, a fixed layer width, a tunnel barrier layer width, and a free layer width in the width direction are all substantially equal with respect to one another. FIG. 1E also shows that a dielectric layer 30 may be formed in-situ with regard to the etch process, for example by conventional conformal deposition processes. The dielectric layer 30 includes a dielectric material, such as a silicon nitride material.

Figure 1F:
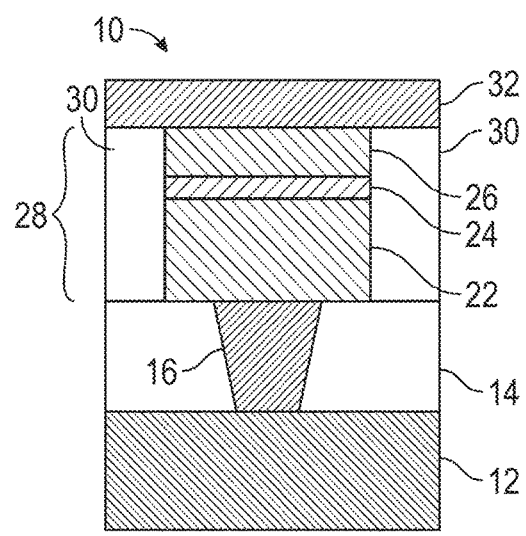

As shown in FIG. 1F, a spin orbit torque coupling layer 32 may be formed overlying the free layer 26 of the lower MTJ stack 28 and the dielectric layer 30 of each of the MRAM structures to be formed. In embodiments, the spin orbit torque coupling layer 32 includes, and/or is formed from, a heavy metal, a chalcogenide material, a magnetic material dielectric material, or combinations thereof. In certain embodiments, the spin orbit torque coupling layer 32 includes, and/or is formed from, a metal such as tantalum (Ta), copper (Cu), platinum (Pt), tin (Sn), zinc (Zn), nickel (Ni), or combinations thereof. The spin orbit torque coupling layer 32 may be utilized as a hard mask for etching of an upper MTJ stack 34, which will be described in detail below, and as an interlayer conduction channel to a bit line of a cell of the MRAM structure. The thickness of the spin orbit torque coupling layer 32 is sufficient to prevent electrical shorting between the MRAM structure and overlying bit line of a cell (not shown). Further, the spin orbit torque coupling layer 32 may also by utilized to isolate the lower MTJ stack 28 from the upper MTJ stack 34.

With reference now to FIG. 1G, in embodiments, a series of material layers 36, 38, and 40 of the MRAM structures 12 are formed overlying one another. As illustrated, a free layer 36 is formed overlying the spin orbit torque coupling layer 32, a tunnel barrier layer 38 is formed overlying the free layer 36, and a fixed layer 40 is formed overlying the tunnel barrier layer 38. Layers 36, 38, and 40 form the basis of the upper MTJ stack 34 of each of the MRAM structures to be formed. The spin orbit torque coupling layer 32 is electrically connected to the free layer 36 of the upper MTJ stack of the corresponding MRAM structure. The thicknesses of each such layer 36, 38, and 40 will depend on the overall dimensions of the corresponding MRAM structure to be formed, as well as the operational parameters of the corresponding MRAM structure to be formed, as is known in the art. The processes used for forming such layers are conventional with respect to the particular material selected and may be the same as described previously for the fixed layer 26, the tunnel barrier layer 24, and the free layer 22.

With reference now to FIG. 1H, in embodiments, a portion of the free layer 36, a portion of the tunnel barrier layer 38, and a portion of the fixed layer 40 is removed, as illustrated. The removal of the portions of layers 36, 38, and 40 may be accomplished using any conventional patterning and etching process. For example, a photoresist layer (not separately illustrated) is deposited over the fixed layer 40 and then is exposed to an image pattern and treated with a developing solution to form a pattern opening within the photoresist layer. With the photoresist layer thus patterned, the layers 36, 38, and 40 are etched away in lateral areas of the layers 36, 38, and 40 remaining in a central area. The free layer 36, the tunnel barrier layer 38, and the fixed layer 40 each have a width in a width direction (the term "width direction" is used herein with respect to a direction that is substantially parallel to an upper surface of the semiconductor substrate of the integrated circuit 10 as shown in FIGS. 1A-1J) that is substantially the same with respect to each such layer 36, 38, and 40. That is, a fixed layer width, a tunnel barrier layer width, and a free layer width in the width direction are all substantially equal with respect to one another. FIG. 1H also shows that a dielectric layer 42 may be formed in-situ with regard to the etch process, for example by conventional conformal deposition processes. The dielectric layer 42 includes a dielectric material, such as a silicon nitride material.

With attention to FIG. 1I, a contact 44 may be disposed on upper MTJ stack 34 with the contact 44 in electrical communication with the upper MTJ stack 34. A top dielectric layer 46 may be formed overlying the upper MTJ stack 34 with the contact 44 extending through the top dielectric layer 46. In embodiments, the top dielectric layer 46 is formed of one or more low-k dielectric materials, such as silicon oxide (SiO), silicon dioxide ($SiO_2$), a porous oxide/porous doped oxide, un-doped silicate glass (USG), silicon nitride, silicon oxynitride, or other commonly used materials. The dielectric constants (k value) of the low-k dielectric materials may be less than about 3.9, for example, less than about 2.8.

The contact 44 may be formed by etching a cavity (not shown) through the top dielectric layer 46 and expose a portion of an upper surface (not shown) of the upper MTJ stack 34 and filling the cavity (not shown) with a conductive material. In this regard, known photolithographic patterning and etching procedures are used to form the cavity (not shown) through the top dielectric layer 46. That is, a photoresist layer (not shown) may be deposited overlying the top dielectric layer 46 and then may be exposed to form an image pattern, followed by application of a developing solution to form pattern openings within the photoresist layer. With the photoresist layer thus patterned, the top dielectric layer 46 may be etched to form the cavity (not shown), which is then filled with the conductive material to form the contact 44. In embodiments, the conductive material may be a copper-containing material, an aluminum-containing material, tungsten-containing material, or combinations thereof. In certain embodiments, the conductive material is a copper-containing material. Chemical mechanical polishing may be used to remove excess conductive material, such that an upper surface of the contact 44 and an upper surface of the top dielectric layer 46 are substantially co-planar, as illustrated. With attention to FIG. 1J, a top electrode layer 48 is formed overlying the top dielectric layer 46 and the contact 44. The top electrode layer 48 is formed of a conductive metal material such as of copper, doped copper alloy (Cu Mx), or a combination thereof.

Figure 2A:
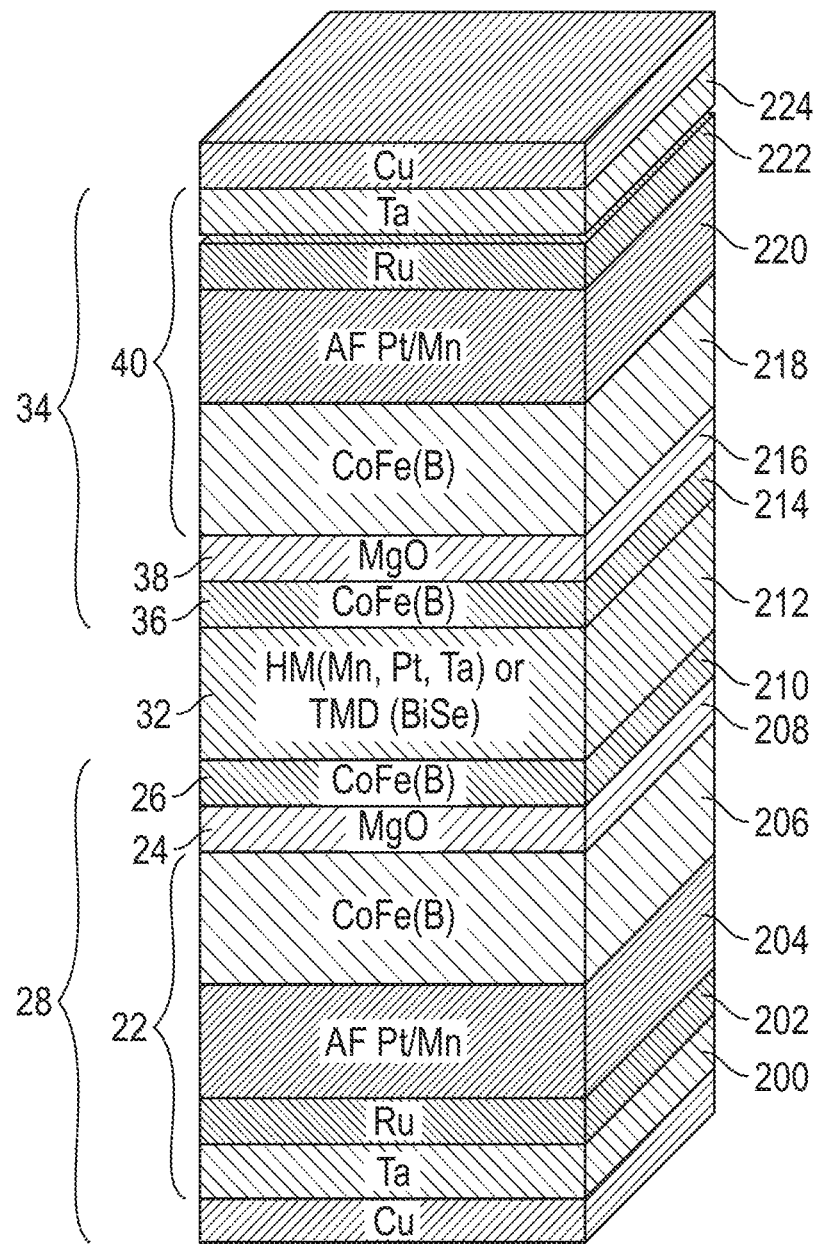
Figure 2B:
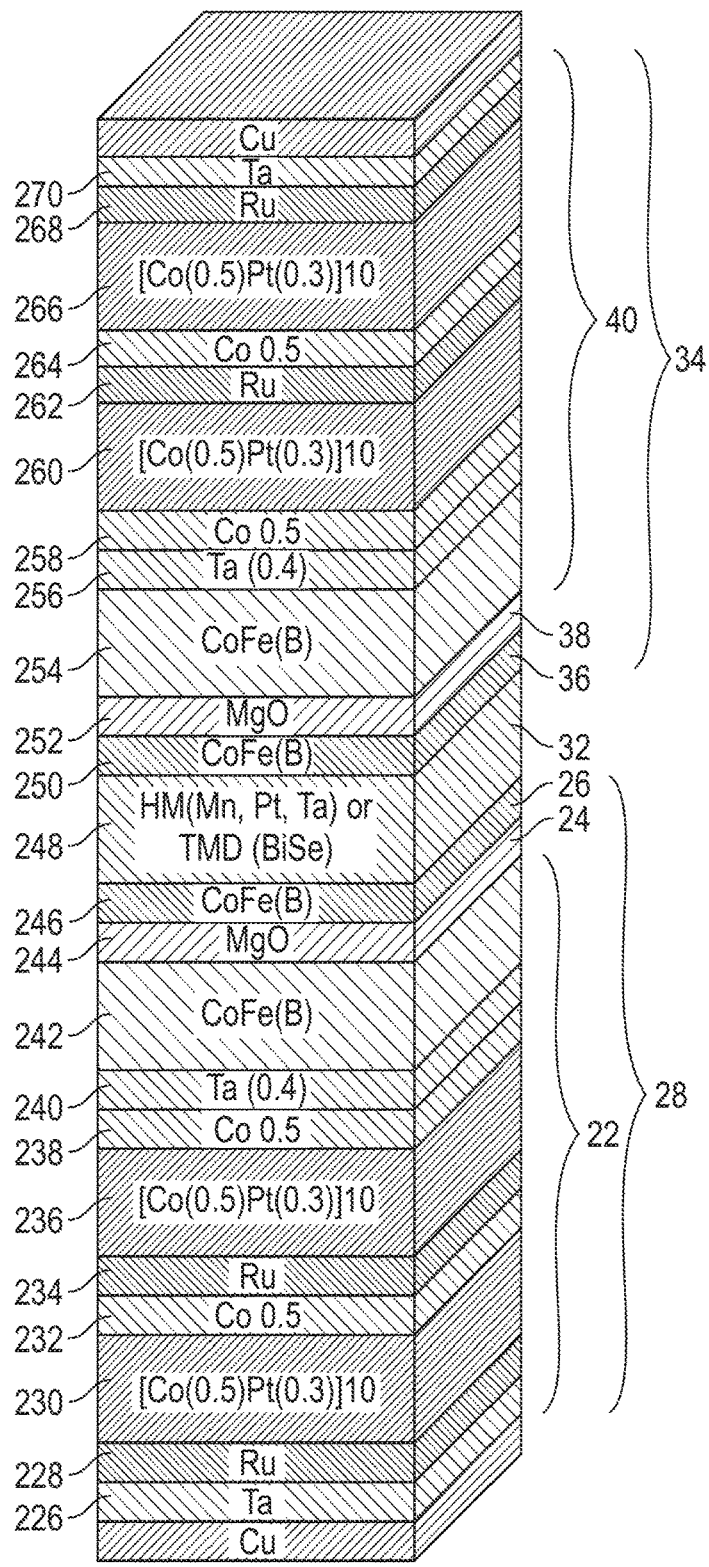

FIGS. 2A and 2B schematically illustrates, in cross section, a plurality of layers for forming the MRAM structure including the lower MTJ stack 28 and the upper MTJ stack 34 with the spin orbit torque coupling layer 32 disposed therebetween. In particular, FIG. 2A illustrates an in-plane stack configuration for the MRAM structure and FIG. 2B illustrates a perpendicular stack configuration for the MRAM structure.

With particular reference to FIG. 2A, the lower MTJ stack 28 may include the fixed layer 22 including a layer 200 including tantalum (Ta), a layer 202 including ruthenium (Ru), a layer 204 including platinum and manganese (Pt/Mn), and a layer 206 including cobalt iron boron (CoFe(B)). The lower MTJ stack 28 may include the dielectric layer 24 including a layer 208 including magnesium oxide (MgO). The lower MTJ stack 28 may include the free layer 26 including a layer 210 including cobalt iron boron (CoFe(B)). The spin orbit torque coupling layer 32 may include a layer 212 including manganese (Mn), platinum (Pt), and tantalum (Ta) or bismuth (Bi) and selenium (Se). The upper MTJ stack 34 may include the free layer 36 including a layer 214 including cobalt iron boron (CoFe(B)). The upper MTJ stack 34 may include the dielectric layer 38 including a layer 216 including magnesium oxide (MgO). The upper MTJ stack 34 may include the fixed layer 40 including a layer 218 including cobalt iron boron (CoFe(B)), a layer 220 including platinum and manganese (Pt/Mn), a layer 222 including ruthenium (Ru), and a layer 224 including tantalum (Ta).

With particular reference to FIG. 2B, the lower MTJ stack 28 may include the fixed layer 22 including a layer 226 including tantalum (Ta), a layer 228 including ruthenium (Ru), a layer 230 including cobalt and platinum ([Co(0.5)Pt(0.3)]10), a layer 232 including cobalt (Co), a layer 234 including ruthenium (Ru), a layer 236 including cobalt and platinum ([Co(0.5)Pt(0.3)]10), a layer 238 including cobalt (Co), a layer 240 including tantalum (Ta), and a layer 242 including cobalt iron boron (CoFe(B)). The lower MTJ stack 28 may include the dielectric layer 24 including a layer 244 including magnesium oxide (MgO). The lower MTJ stack 28 may include the free layer 26 including a layer 246 including cobalt iron boron (CoFeB). The spin orbit torque coupling layer 32 may include a layer 248 including manganese (Mn), platinum (Pt), and tantalum (Ta) or bismuth (Bi) and selenium (Se). The upper MTJ stack 34 may include the free layer 36 including a layer 250 including cobalt iron boron (CoFeB). The upper MTJ stack 34 may include the dielectric layer 38 including a layer 252 including magnesium oxide (MgO). The upper MTJ stack 34 may include the fixed layer 40 including a layer 254 including cobalt iron boron (CoFeB), a layer 256 including tantalum (Ta), a layer 258 including cobalt (Co), a layer 260 including cobalt and platinum ([Co(0.5)Pt(0.3)]10), a layer 262 including ruthenium (Ru), a layer 264 including cobalt (Co), a layer 266 including cobalt and platinum ([Co(0.5)Pt(0.3)]10), a layer 268 including ruthenium (Ru), and a layer 270 including tantalum (Ta).

Figure 3:
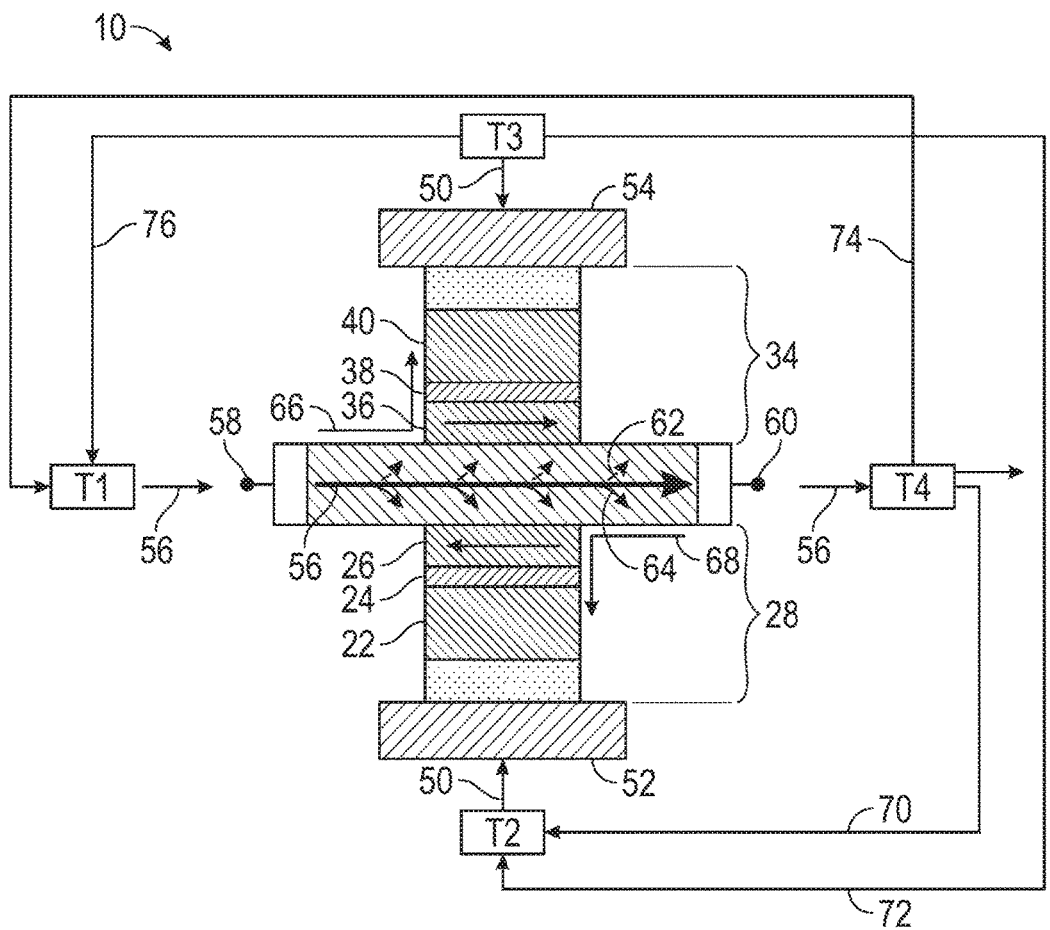

FIG. 3 schematically illustrates, in cross section, the lower MTJ stack 28 and the upper MTJ stack 34 with the spin orbit torque coupling layer 32 disposed therebetween. As described above, each of the MTJ stacks 28, 34 may include the free layer 26, 36 adjacent the spin orbit torque coupling layer 32. The tunnel barrier layer 24, 38 may be adjacent the free layer 26, 36 and spaced from the spin orbit torque coupling layer 32. The fixed layer 22, 40 may be adjacent the tunnel barrier layer 24, 38 and spaced from the free layer 26, 36. The free layer 26, 36 of each of the MTJ stacks 28, 34 may be configured to switch between a parallel magnetization and an antiparallel magnetization relative to the fixed layer 22, 40 of each of the MTJ stacks 28, 34 in the presence of an electrical voltage 50 across each of the MTJ stacks 28, 34. The free layer 26, 36 of each of the MTJ stacks 28, 34 has a switching energy barrier for switching between the parallel magnetization and the antiparallel magnetization relative to the fixed layer 22, 40 of each of the MTJ stacks 28, 34. In certain embodiments, the switching energy barrier for each of the free layers 26, 36 is reduced in the presence of the electrical voltage 50 across each of the MTJ stacks 28, 34. In various embodiments, the reduction of the switching energy barrier for switching between the parallel magnetization and the antiparallel magnetization of the free layer 26, 36 is due to a voltage controlled magnet anistropy (VCMA) effect. For example, when the electrical voltage 50 is applied across terminals 52 to 60 and terminals 54 to 60, the switching energy barrier for the free layers 26 and 36 may be reduced. It is to be appreciated that when the electrical voltage 50 is applied across terminals 52 to 60 and terminals 54 to 60 as a positive voltage (i.e., +ve voltage), the switching energy barrier for the free layers 26 and 36 may be reduced. However, when the electrical voltage 50 is applied across terminals 52 to 60 and terminals 54 to 60 as a negative voltage (i.e., −ve voltage), the switching energy barrier for the free layers 26 and 36 may be increased.

With continuing attention to FIG. 3, The spin orbit torque coupling layer 32 may be configured to receive an electrical current 56, for example from terminals 58 or 60. The electrical current 56 may by applied from terminals 58 to 60 or from terminals 60 to 58 across the spin orbit torque coupling layer 32. The spin orbit torque coupling layer 32 may generate an up polarized current 62 and a down polarized current 64 in response to the electrical current 56. In certain embodiments, the generation of the up polarized current 62 and the down polarized current 64 in response to the electrical current 56 results from a spin orbit torque (SOT) effect due to the induced spin hall effect. The down polarized current 64 may be configured to induce torque on the free layer 26 of the lower MTJ stack 28. The up polarized current 62 may be configured to induce torque on the free layer 36 of the upper MTJ stack 34. The up polarized current 62 and the down polarized current 64, due to the flow of electrical current through the spin orbit torque coupling layer 32, is depicted by respective sharp right lines 66 and 68. Due to the directionality of the polarized currents 62 and 64, when the electrical current 56 is applied across terminal 58 to terminal 60, the upper free layer 36 may switch in conjunction with the electrical current 56, while the lower free layer 26 may switch in opposite direction relative to the electrical current 56. In contrast (not shown), when the electrical current 56 is applied across terminal 60 to terminal 58, the upper free layer 36 may switch in opposite direction relative to the electrical current 56, while the lower free layer 26 may switch in conjunction with the electrical current 56. By inducing torque on the free layer 26, 36 of the MTJ stacks 28, 34, the switching energy barrier, which may be reduced by the VCMA effect, may overcome the switching energy barrier thereby switching magnetization of the free layers 26, 36. Notably, without the SOT effect, the switching energy barrier of the free layer 26, 36 of the MTJ stacks 28, 34, even when reduced by the VCMA effect, may not permit switching of the magnetization of the free layer 26, 36 alone. The switch is accomplished by applying the electrical current 56 across the spin orbit torque coupling layer 32 for inducing torque in combination with applying the electrical voltage 50 across the MTJ stacks 28, 34 for reducing the switching energy barrier thereby overcoming the switching energy barrier by the electrical current 56. It is to be appreciated that the electrical voltage 50 and the electrical current 56 can be applied simultaneously or in quick succession such that the electrical voltage 50 is applied first followed by the electrical current 56.

With continuing attention to FIG. 3, the up polarized current 62 and the down polarized current 64, due to the flow of electrical current through the spin orbit torque coupling layer 32, is depicted by respective sharp right lines 66 and 68. By allowing or restricting the current flow through individual MTJ stacks 28, 34, through transistors (e.g., T1, T2, T3, and T4) that can be connected to terminals 52 and 54 respectively, the MTJ stacks 28, 34 can be programmed individually. As such, the MTJ stacks 28, 34 can store an independent bit, resulting in a dual bit configuration.

In embodiments, the MTJ stacks 28, 34 are in electrical communication with one or more transistors. Under this scenario, the terminal 52 (e.g., BEOL interconnect) and the terminal 54 are in electrical communication with a drain of a transistor T2 and transistor T3 respectively of a cell. The transistors T2 and T3 control the application of voltage through the MTJ stacks 28, 34 accordingly. Terminals 58 and 60 of the spin orbit torque coupling layer 32 are in electrical communication with a drain of a transistor T1 and transistor T4 respectively of the cell, which controls the flow of current through the spin orbit torque coupling layer 32.

The MRAM structures may be configured to operate in a dual bit read/write operation. In exemplary embodiments, the wiring configuration for transistors T1-T4, is as depicted by wires 70, 72, 74, and 76. In this configuration, the electrical current 56 across terminal 58 to terminal 60 and the electrical voltage 50 across terminal 52 to terminal 58 may result in switching of magnetization of the lower MTJ stack 28 (dual bit write operation for the lower MTJ stack 28). The electrical current 56 across terminal 58 to terminal 60 and the electrical voltage 50 across terminal 54 and terminal 60 may result in switching of magnetization of the upper MTJ stack 34 (dual bit write operation for the upper MTJ stack 34). A read current (not shown) across terminal 52 and terminals 58 or 60 may result in determining the resistivity of the lower MTJ stack 28 (dual bit read operation for the lower MTJ stack 28). The read current (not shown) across terminal 54 and terminals 58 or 60 may result in determining the resistivity of the upper MTJ stack 34 (dual bit read operation for the upper MTJ stack 34).

In certain embodiments, the spin orbit torque coupling layer 32 is shared between a plurality of MRAM structures such that transistors T1 and T4 can be shared, thereby reducing area/component overhead. Furthermore, transistors T2 and T3, may be in electrical communications with word lines (or bit lines) for interconnecting the transistor gates in accordance with an array configuration. Various other configurations may be employed in accordance with the exemplary embodiments herein for enabling single and multiple bit/cell device execution.

Figure 4:
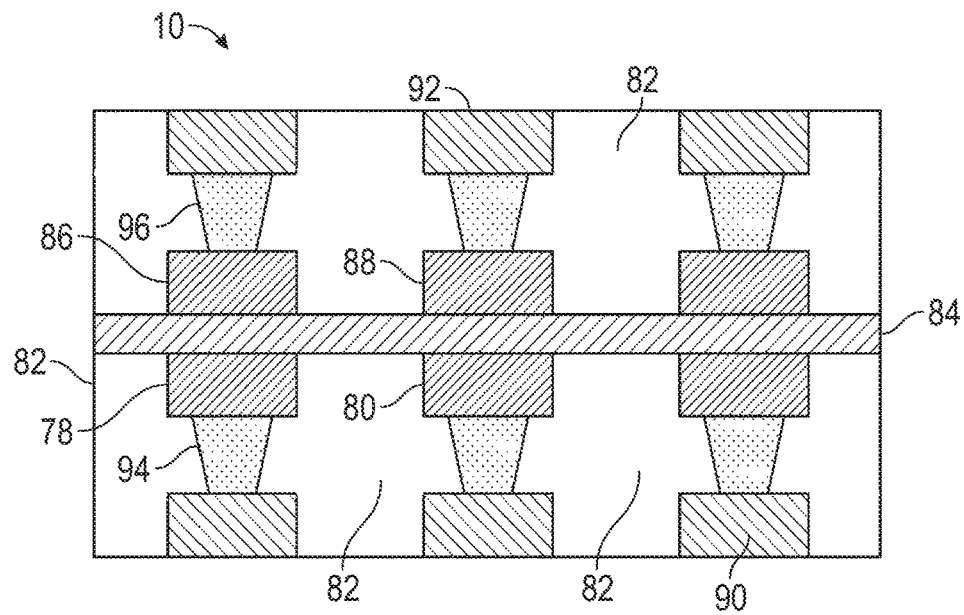

FIG. 4 schematically illustrates, in cross section, a plurality of MRAM structures configured in an array according to an exemplary embodiment. The array of the integrated circuit 10 includes a first lower MTJ stack 78 overlying the semiconductor substrate and a second lower MTJ stack 80 spaced from the first lower MTJ stack 78 and overlying the semiconductor substrate. In certain embodiments, the first lower MTJ stack 78 and the second lower MTJ stack 88 are vertically and symmetrically placed to each other. The array further includes a dielectric layer 82 disposed between the first lower MTJ stack 78 and the second lower MTJ stack 80 with the dielectric layer 82 overlying the semiconductor substrate. The array further includes a spin orbit torque coupling layer 84 overlying the first lower MTJ stack 78, the dielectric layer 82, and the second lower MTJ stack 80. In other word, the spin orbit torque coupling layer 84 is shared between multiple MRAM structures. The array further includes a first upper MTJ stack 86 overlying the spin orbit torque coupling layer 84 and the first lower MTJ stack 78 and a second upper MTJ stack 88 overlying the spin orbit torque coupling layer 84 and the second lower MTJ stack 80. The array further includes a plurality of bottom electrode layers 90, a plurality of top electrode layers 92, a plurality of conductive via structures 94, and a plurality of contacts 96. In certain embodiments, the integrated circuit 10 includes a plurality of integrated transistor circuits (not shown) formed on the semiconductor substrate (not shown) with the integrated transistor circuits configured provide electrical current to each of the MTJ stacks.

With continuing reference to FIG. 4, in embodiments, the spin orbit torque coupling layer 84 serves as a write assist line for providing electrical current to each MRAM structure. In certain embodiments, each MTJ stack 78, 80 86, 88, stores a bit, thus enabling dual bit operation. It is contemplated herein, in certain embodiments, that first MTJ stack 78, 86 and the second MTJ stack 80, 88 forms/occupies a single cell while housing two bits. As such, the array illustrated in FIG. 4 includes at least two adjacently configured stacked MRAM structures to form/occupy at least two cells with multiple bits. In another embodiment, the array may spatially form/occupy fewer cells due to the adjacent connection of respective MTJ stack. In yet another embodiment, the array may form/occupy cells having varying functions, i.e., a cell that operates on up polarized current versus another that operates on down polarized current.

Figure 5:
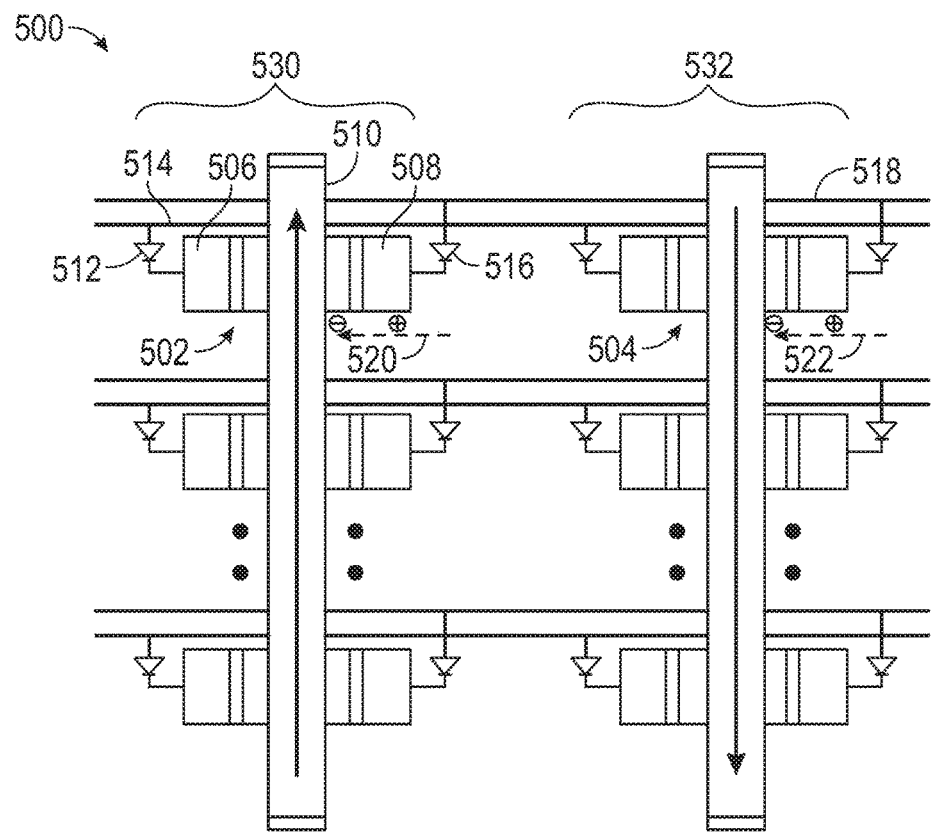
Figure 6:
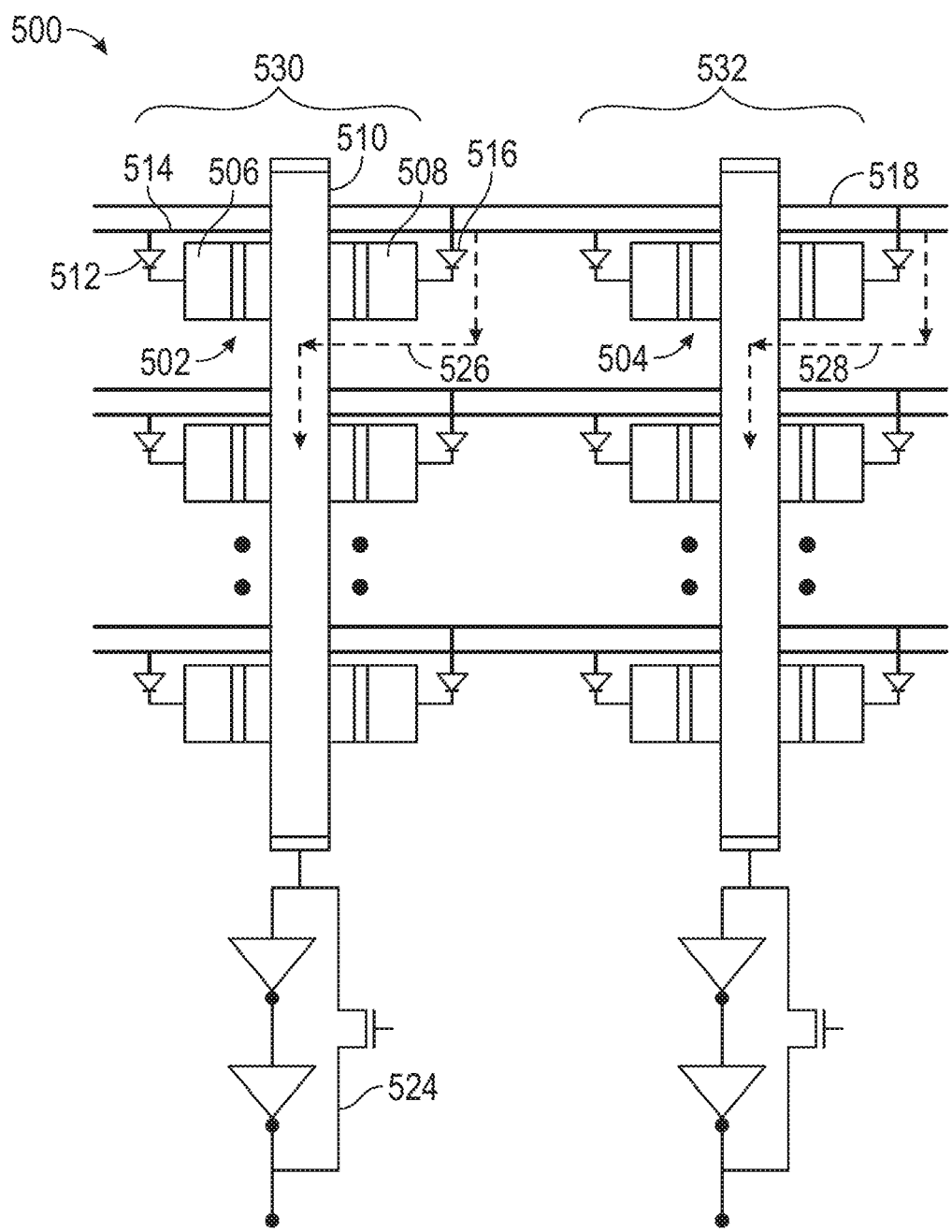

FIGS. 5-8 schematically illustrate, in cross section, various MRAM structures configured to operate in dual bit read/write operations, according to exemplary embodiments. In embodiments, dual bit operations result in the lower free layer of the lower MTJ stacks and the upper free layer of the upper MTJ stack being configured to have magnetizations independent of each other. In FIGS. 5 and 6, a memory array 500 is depicted. In this example, dual bit read/write operation is performed in a bit interleaving cycle such that two words are programmed in two cycles. As described previously, the MRAM structures (e.g., 502 and 504) include a first lower MTJ stack and a first upper MTJ stack (e.g., MTJ stacks 506 and 508) for storing a respective bit. A spin orbit torque coupling layer (e.g., 510) is shared by all the MRAM structures for channeling electrical current to each device. A first diode 512 may be in electrical communication with the first lower MTJ stack 506. A second diode 516 may be in electrical communication with the first upper MTJ stack 508.

As illustrated, the diodes are further connected to word lines or bit lines for interconnecting multiple arrays 530 and 532 to one another within a multiple array topography. Notably, the sharing of the spin orbit torque coupling layer 710 by respective arrays 530 and 532 reduced the number of transistors required per bit cell. By way of example, a single transistor may be connected to the spin orbit torque coupling layer 510 as a control component rather than one or two additional transistors being required per memory device. Therefore, this increases the density of the memory array 500 without increasing power consumption or adversely impacting the array fabrication process.

For the purpose of illustration herein, rows of interconnected memory structures within the array 500 are activated by word lines. A first word line 514 may be in electrical communication with the first diode 512. A second word line 518 may be electrically isolated from the first word line 514 and may be in electrical communication with the second diode 516. Per this approach, the first and second diodes 512, 516 in electrical communication with the MTJ stacks 506, 508 are driven by two different word lines 514 and 518, respectively. For example, when the first word line 514 is deactivated (OFF) and the second word line 518 is activated (ON), electrical voltage 520 and 522 is only applied across the upper MTJ stacks (e.g., 508) but not the lower MTJ stacks (e.g., 506). Therefore, two or more bits corresponding to a word are programmed within a single cycle in the upper MTJ stacks (e.g., 508) without programming lower MTJ stacks (e.g., 506). In the next cycle, two or more bits corresponding to another word are programmed in the lower MTJ stacks (e.g., 506) by activating the first word line 514 (ON) but not in the upper MTJ stacks (e.g., 508) by deactivating the second word line 518 (OFF). With particular reference to FIG. 6, a sensing circuit (e.g., 524) may be electrical communication with the spin orbit torque coupling layer 510. The sensing circuit 524 may be configured to determine a difference in resistances of the first lower MTJ stack 506 and the first upper MTJ stack 508 in the presence of read currents (e.g., 526 and 528).

Figure 7:
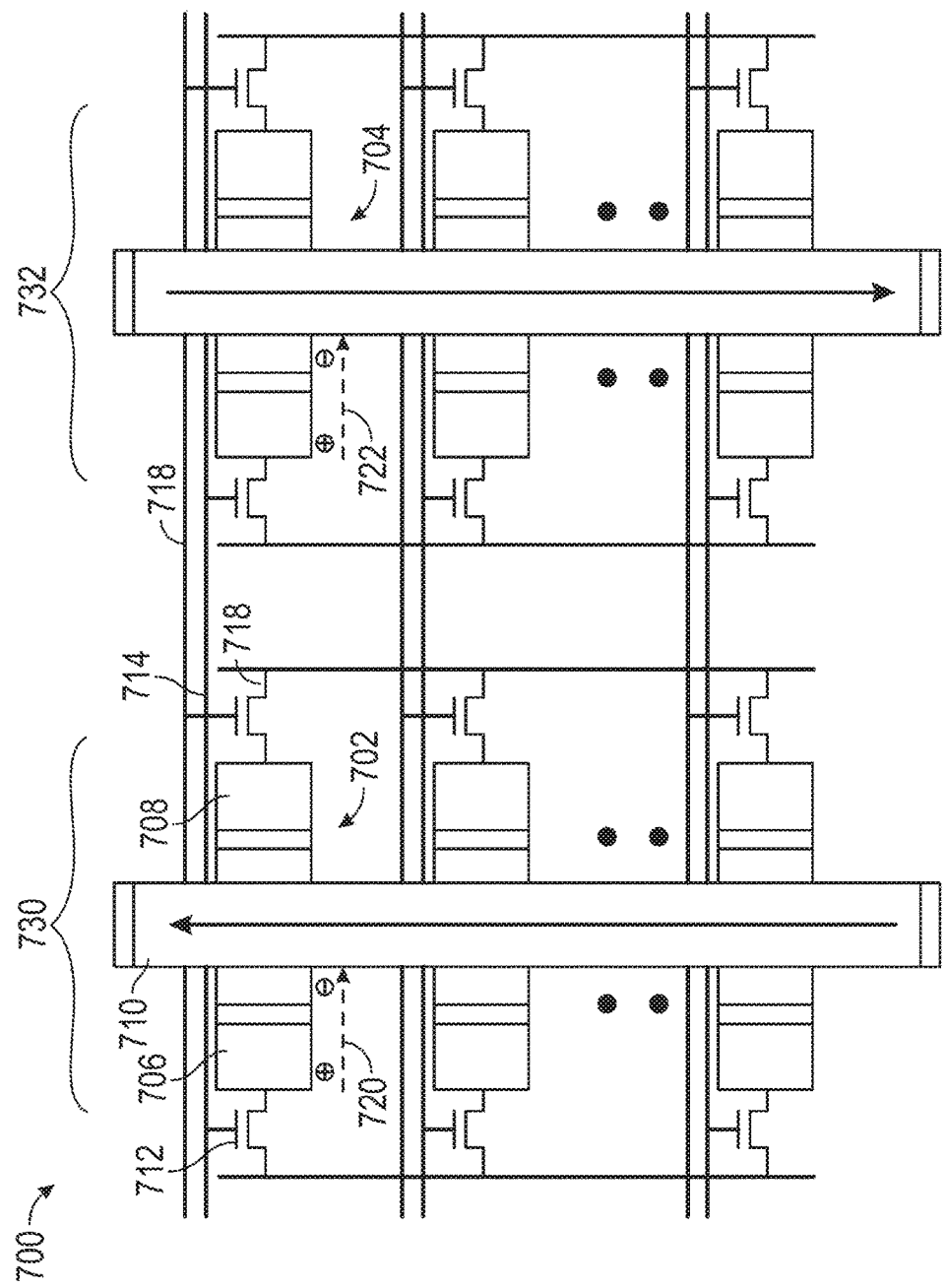

In FIG. 7, another memory array 700 is depicted. In this example, dual bit read/write operation is once again performed in a bit interleaving cycle such that two or more words are programmed in two cycles. As described previously, the MRAM structures (e.g., 702 and 704) include a first lower MTJ stack and a first upper MTJ stack (e.g., MTJ stacks 706 and 708) for storing a respective bit. A spin orbit torque coupling layer (e.g., 710) is shared by all the MRAM structures for channeling electrical current to each device. A first pass-gate transistor 712 may be in electrical communication with the first lower MTJ stack 706. A second pass-gate transistor 716 may be in electrical communication with the first upper MTJ stack 708.

As illustrated, the transistors are further connected to word lines or bit lines for interconnecting multiple arrays 730 and 732 to one another within a multiple array topography. Word-lines are constructed as gate-contact lines—metallic or poly-Si (or a combination thereof) stripes that run across the circuit to connect the gates of all transistors for a specific array element. Thus, when activating or deactivating a word line, i.e. increasing/decreasing the voltage on/from it, all the connected transistors will open or correspondingly close. Notably, once again the sharing of the spin orbit torque coupling layer 710 by respective arrays 730 and 732 reduced the number of transistors required per bit cell. By way of example, a single transistor may be connected to the spin orbit torque coupling layer 710 as a control component rather than one or two additional transistors being required per memory device. Therefore, this increases the density of the memory array 700 without increasing power consumption or adversely impacting the array fabrication process.

For the purpose of illustration herein, rows of interconnected memory structures within the array 700 are activated by word lines while columns are configured to bit lines. A first word line 714 may be in electrical communication with the pass-gate transistor 712. A second word line 718 may be electrically isolated from the first word line 714 and may be in electrical communication with the second pass-gate transistor 716. Per this approach, the first and second pass-gate transistors 712, 716 in electrical communication with the MTJ stacks 706, 708 are driven by two different word lines 714 and 718, respectively. For example, when the second word line 718 is deactivated (OFF) and the first word line 714 is activated (ON), electrical voltage 720 and 722 is only applied across the lower MTJ stacks (e.g., 706) but not the upper MTJ stacks (e.g., 708). Therefore, two or more bits corresponding to a word are programmed within a single cycle in the lower MTJ stacks (e.g., 706) without programming upper MTJ stacks (e.g., 708). In the next cycle, two or more bits corresponding to another word are programmed in the upper MTJ stacks (e.g., 708) by activating the second word line 718 (ON) but not in the lower MTJ stacks (e.g., 706) by deactivating the first word line 714 (OFF). Although not shown, a sensing circuit may be electrical communication with the spin orbit torque coupling layer 710. The sensing circuit may be configured to determine a difference in resistances of the first lower MTJ stack 706 and the first upper MTJ stack 708 in the presence of read currents.

Figure 8:
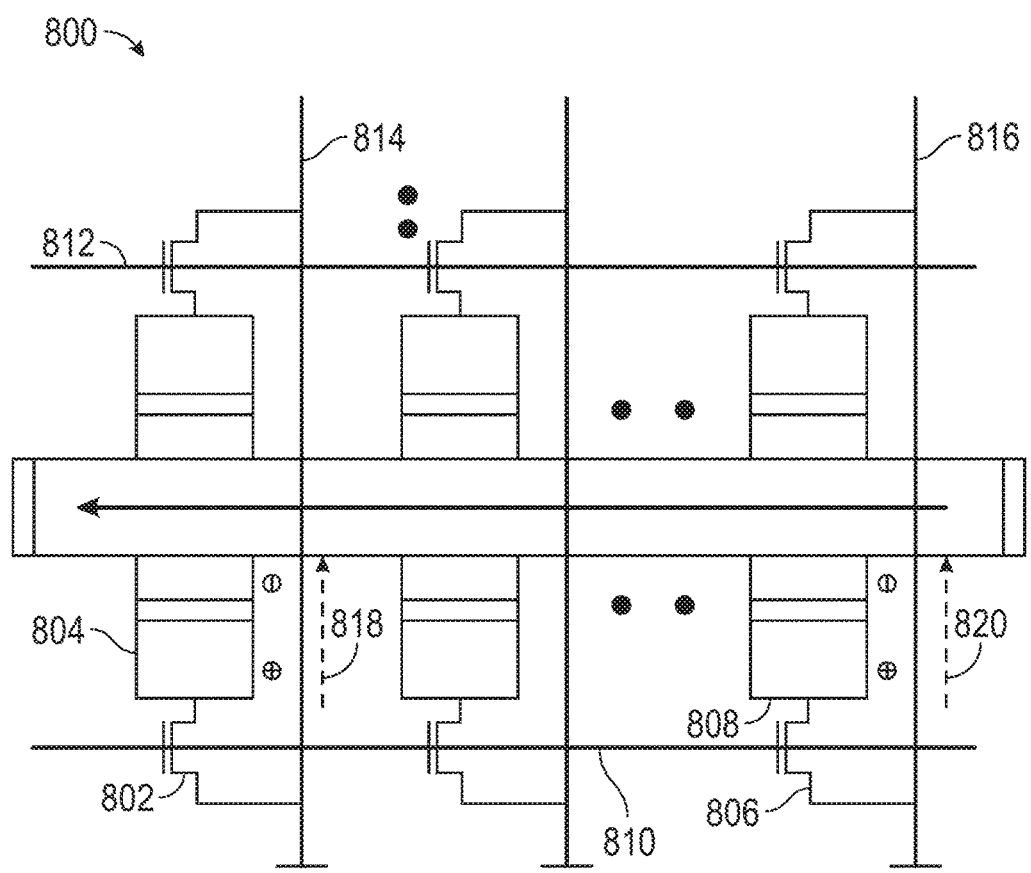

In FIG. 8, another memory array 800 is shown for dual bit operation wherein, in embodiments, a single word is programmed in a two cycle operation using a single word line, without utilizing bit interleaving. A first pass-gate transistor 802 may be in electrical communication with a first lower MTJ stack 804. A second pass-gate transistor 806 may be in electrical communication with a second lower MTJ stack 808. A first word line 810 may be in electrical communication with the first pass-gate transistor 802 and the second pass-gate transistor 806. A second word line 812 may be electrically isolated from the first word line 810. During operation, the first word line 810 may be activated (ON) and the second word line 812 may be deactivated (OFF) with a current passing through the spin orbital coupling layer in a first direction. In this scenario, in a first cycle, electrical voltage 818 is applied across the first lower MTJ stack 804 and writes a "1" and electrical voltage 820 is applied across the second lower MTJ stack 808 and writes a "1". In the second cycle (not shown), electrical voltage is applied across the another lower MTJ stack while the current passes through the spin orbital coupling layer in an opposite direction and writes a "0".

Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, digital cameras, artificial, and neural networks. The devices described herein may be suitable as replacements for SRAM cache memory.

The present disclosure may be embodied in other specific forms without departing from the spirit or essential characteristics thereof. The foregoing embodiments, therefore, are to be considered in all respects illustrative rather than limiting. The scope of the subject matter is thus indicated by the appended claims, rather than by the foregoing description, and all changes that come within the meaning and range of equivalency of the claims are intended to be embraced therein.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. An integrated circuit comprising a plurality of magnetic random access memory (MRAM) structures, said integrated circuit comprising:
    a semiconductor substrate;
    a first lower magnetic tunnel junction stack (MTJ stack) overlying said semiconductor substrate with said first lower MTJ stack comprising a first lower free layer;
    a spin orbit torque coupling layer overlying said first lower MTJ stack;
    a first upper MTJ stack overlying said spin orbit torque coupling layer and said first lower MTJ stack with said first upper MTJ stack comprising a first upper free layer;
    a second lower MTJ stack spaced from said first lower MTJ stack and overlying said semiconductor substrate;
    a dielectric layer disposed between said first lower MTJ stack and said second lower MTJ stack, said dielectric layer overlying said semiconductor substrate, and said spin orbit torque coupling layer overlying said first lower MTJ stack, said dielectric layer, and said second lower MTJ stack; and
    a second upper MTJ stack overlying said spin orbit torque coupling layer and said second lower MTJ stack.

2. The integrated circuit of claim 1, further comprising:
    a first pass-gate transistor in electrical communication with said first lower MTJ stack;
    a second pass-gate transistor in electrical communication with said second lower MTJ stack; and
    a first word line in electrical communication with said first pass-gate transistor and said second pass-gate transistor.

3. A method for fabricating an integrated circuit comprising a plurality of magnetic random access memory (MRAM) structures, the method comprising:
    forming a first lower magnetic tunnel junction stack (MTJ stack) overlying a semiconductor substrate with the first lower MTJ stack comprising a first lower free layer;
    forming a spin orbit torque coupling layer overlying the first lower MTJ stack;
    forming a first upper MTJ stack overlying the spin orbit torque coupling layer and the first lower MTJ stack;
    forming a second upper MTJ stack overlying the spin orbit torque coupling layer and the second lower MTJ stack with the first upper MTJ stack comprising a first upper free layer;
    forming a second lower MTJ stack spaced from said first lower MTJ stack and overlying said semiconductor substrate;
    forming a dielectric layer disposed between said first lower MTJ stack and said second lower MTJ stack, said dielectric layer overlying said semiconductor substrate, and said spin orbit torque coupling layer overlying said first lower MTJ stack, said dielectric layer, and said second lower MTJ stack; and
    forming a second upper MTJ stack overlying said spin orbit torque coupling layer and said second lower MTJ stack.

4. The method of claim 3, further comprising:
    forming a first pass-gate transistor in electrical communication with the first lower MTJ stack;
    forming a second pass-gate transistor in electrical communication with the first upper MTJ stack; and
    forming a first word line in electrical communication with the first pass-gate transistor and the second pass-gate transistor.

5. The method of claim 3, wherein the tunnel barrier layer comprises magnesium oxide.

6. The method of claim 3, wherein the tunnel barrier layer has a first surface adjacent the free layer and a second surface adjacent the fixed layer with the first surface and the second surface defining a tunnel barrier layer thickness therebetween in an amount of at least about 1 nm.

* * * * *